(12) United States Patent
Terakawa

(10) Patent No.: US 7,893,351 B2
(45) Date of Patent: Feb. 22, 2011

(54) PHOTOVOLTAIC DEVICE AND MANUFACTURING METHOD THEREOF

(75) Inventor: Akira Terakawa, Nara (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 184 days.

(21) Appl. No.: 12/045,247

(22) Filed: Mar. 10, 2008

(65) Prior Publication Data
US 2008/0230121 A1 Sep. 25, 2008

(30) Foreign Application Priority Data
Mar. 19, 2007 (JP) ............................. 2007-070014

(51) Int. Cl.
*H01L 31/00* (2006.01)
*H01L 21/00* (2006.01)
(52) U.S. Cl. .................. 136/261; 438/96; 257/E31.003
(58) Field of Classification Search ................. 136/261; 438/96; 257/E31.003
See application file for complete search history.

(56) References Cited

U.S. PATENT DOCUMENTS

| 4,547,621 A | * | 10/1985 | Hack et al. .................. 136/249 |
| 5,716,480 A | * | 2/1998 | Matsuyama et al. ......... 136/249 |
| 6,346,732 B1 | * | 2/2002 | Mizushima et al. ......... 257/382 |
| 7,164,150 B2 | | 1/2007 | Terakawa et al. |
| 2003/0168660 A1 | * | 9/2003 | Terakawa et al. ............. 257/52 |
| 2006/0148218 A1 | * | 7/2006 | Yamazaki et al. ........... 438/486 |

FOREIGN PATENT DOCUMENTS

JP        2003-258287 A1        9/2003

OTHER PUBLICATIONS

Platz, R. et al., "Plasma-enhanced chemical vapor deposition of intrinsic microcrystalline silicon from chlorine-containing source gas", Aug. 1998, Princeton University, pp. 1-22.*
Kinoshita et al., "Influence of Oxygen and Nitrogen in the Intrinsic Layer of a-Si:H Solar Cells", Jul. 1996, Jpn. J. Appl. Phys., vol. 35, pp. 3819-3824.*

* cited by examiner

*Primary Examiner*—Basia Ridley
*Assistant Examiner*—Tamir Ayad
(74) *Attorney, Agent, or Firm*—Marvin A. Motsenbocker; Mots Law, PLLC

(57) ABSTRACT

A photovoltaic device capable of improving an output characteristic is provided. The photovoltaic device includes an n-type single-crystal silicon substrate, a p-type amorphous silicon substrate, and a substantially intrinsic i-type amorphous silicon layer disposed between the n-type single-crystal silicon substrate and the p-type amorphous silicon layer. The i-type amorphous silicon layer includes: a first section which is located on the n-type single-crystal silicon substrate side, and which has an oxygen concentration equal to or below $10^{20}$ cm$^{-3}$; and a second section which is located on the p-type amorphous silicon layer side, and which has an oxygen concentration equal to or above $10^{20}$ cm$^{-3}$.

14 Claims, 3 Drawing Sheets

PHOTOVOLTAIC DEVICE AND MANUFACTURING METHOD THEREOF

CROSS REFERENCE TO RELATED APPLICATIONS

This application claims priority based on 35 USC 119 from prior Japanese Patent Application No. P2007-070014 filed on Mar. 19, 2007, the entire contents of which are incorporated herein by reference.

BACKGROUND OF THE INVENTION

1. Field of the Invention

This invention relates to a photovoltaic device and a manufacturing method thereof. More specifically, the invention relates to a photovoltaic device including a substantially intrinsic second amorphous silicon layer located between crystalline silicon and a first amorphous silicon layer.

2. Description of Related Art

A photovoltaic device with the following structure has heretofore been known. Specifically, the photovoltaic device includes a substantially intrinsic second amorphous silicon layer (an i-type amorphous silicon layer) located between crystalline silicon (an n-type single-crystal silicon substrate) and a first amorphous silicon layer (a p-type amorphous silicon layer). Such photovoltaic device is disclosed in, for example, Japanese Patent Application Publication No. 2003-258287 (hereinafter referred to as "Patent Document 1").

A photovoltaic device including a substantially intrinsic second amorphous silicon layer (an i-type amorphous silicon layer) located between crystalline silicon (an n-type single-crystal silicon substrate) and a first amorphous silicon layer (a p-type amorphous silicon layer) has heretofore been known as disclosed in, for example, Japanese Patent Application Publication No. 2003-258287 (hereinafter referred to as "Patent Document 1").

Patent Document 1 discloses a photovoltaic device has an increased oxygen concentration in the vicinity of the interface between an i-type amorphous silicon layer and an n-type single-crystal silicon substrate. By employing this configuration, defect density at the interface between the i-type amorphous silicon layer and the n-type single-crystal silicon substrate is reduced and occurrence of carrier recombination is thereby suppressed. In this way, Patent Document 1 achieves improvement in output characteristics of the photovoltaic device.

SUMMARY OF THE INVENTION

An aspect of the invention provides a photovoltaic device that comprises: crystalline silicon of a first conductivity type; a first amorphous silicon layer of a second conductivity type; a substantially intrinsic second amorphous silicon layer disposed between the crystalline silicon and the first amorphous silicon layer, the second amorphous silicon layer comprising: a first section located on the crystalline silicon side and having a first oxygen concentration equal to or below $10^{20}$ cm$^{-3}$, and a second section located on the first amorphous silicon layer side and having a second oxygen concentration equal to or above $10^{20}$ cm$^{-3}$.

Here, the crystalline silicon includes a crystalline silicon substrate, thin-film polycrystalline silicon formed on a substrate, and the like. Meanwhile, the first amorphous silicon layer and the second amorphous silicon layer include not only the amorphous silicon layers but also microcrystalline silicon layers.

According to the photovoltaic device of this aspect, as described above, in the substantially intrinsic second amorphous silicon layer, there are formed the first section which is located on the crystalline silicon side and which has the first oxygen concentration equal to or below $10^{20}$ cm$^{-3}$, as well as the second section which is located on the first amorphous silicon layer side and which has the second oxygen concentration equal to or above $10^{20}$ cm$^{-3}$. In this way, in the substantially intrinsic second amorphous silicon layer, it is possible to reduce the oxygen concentration of the crystalline silicon side, and to increase the oxygen concentration on the first amorphous silicon layer side. Accordingly, by using the first section which is located on the crystalline silicon side of the second amorphous silicon layer and which is low in oxygen concentration, the crystalline silicon side of the substantially intrinsic second amorphous silicon layer can be made to be the high-quality amorphous silicon with few impurities (oxygen). In addition, by using the first section, occurrence of capture of photogenerated carriers in the first section can be suppressed, because defects attributable to the oxygen in the first section are decreased.

Moreover, by using the second section which is located on the first amorphous silicon layer side of the second amorphous silicon layer and which is high in oxygen concentration, the first amorphous silicon layer side of the second amorphous silicon layer can be made to have a relatively strong n-type property, due to the oxygen having a property as an n-type dopant. In this way, when the second conductivity type first amorphous silicon layer is of the p-type, it is possible to strengthen an internal electric field in the vicinity of the interface between the substantially intrinsic second amorphous silicon layer and the second conductivity type (p-type) first amorphous silicon layer. Therefore, it is possible to separate the photogenerated carriers smoothly. As described above, since it is possible: to suppress occurrence of capture of the photogenerated carriers on the crystalline silicon side of the substantially intrinsic second amorphous silicon layer; and to separate the photogenerated carriers smoothly on the p-type first amorphous silicon layer side of the second amorphous silicon layer, output characteristics of the photovoltaic device can be further improved.

Another aspect of the invention provides a method of manufacturing a photovoltaic device comprising: performing a treatment on a surface of crystalline silicon of a first conductivity type; forming a substantially intrinsic second amorphous silicon layer on the crystalline silicon of the first conductivity type, such that an oxygen concentration is low in a first face, on the first conductivity type crystalline silicon side, of the second amorphous silicon layer, and that an oxygen concentration is high in a second face of the second amorphous silicon layer, the second face being opposite to the first face on the first conductivity type crystalline silicon side; forming a first amorphous silicon layer of a second conductivity type on the second amorphous silicon layer; and processing a face, opposite to that on which the second amorphous silicon layer is formed, of the crystalline silicon of the first conductivity type.

DETAILED DESCRIPTION OF EMBODIMENTS

Now, embodiments of the invention will be described with reference to the accompanying drawings. It is to be noted that the respective drawings show examples, and that the invention shall not be limited only to dimensional ratios and other factors appearing on the drawings. Therefore, concrete dimensions and other factors should be determined in consideration of the following explanation. Moreover, there may be differences between the respective drawings in light of dimensional relations and proportions.

Prepositions, such as "on", "over" and "above" may be defined with respect to a surface, for example a layer surface, regardless of that surface's orientation in space. Preposition "above" may be used in the specification and claims even if a layer is in contact with another layer. Preposition "on" may be used in the specification and claims when a layer is not in contact with another layer, for example, there is an intervening layer between them.

Figure 1:
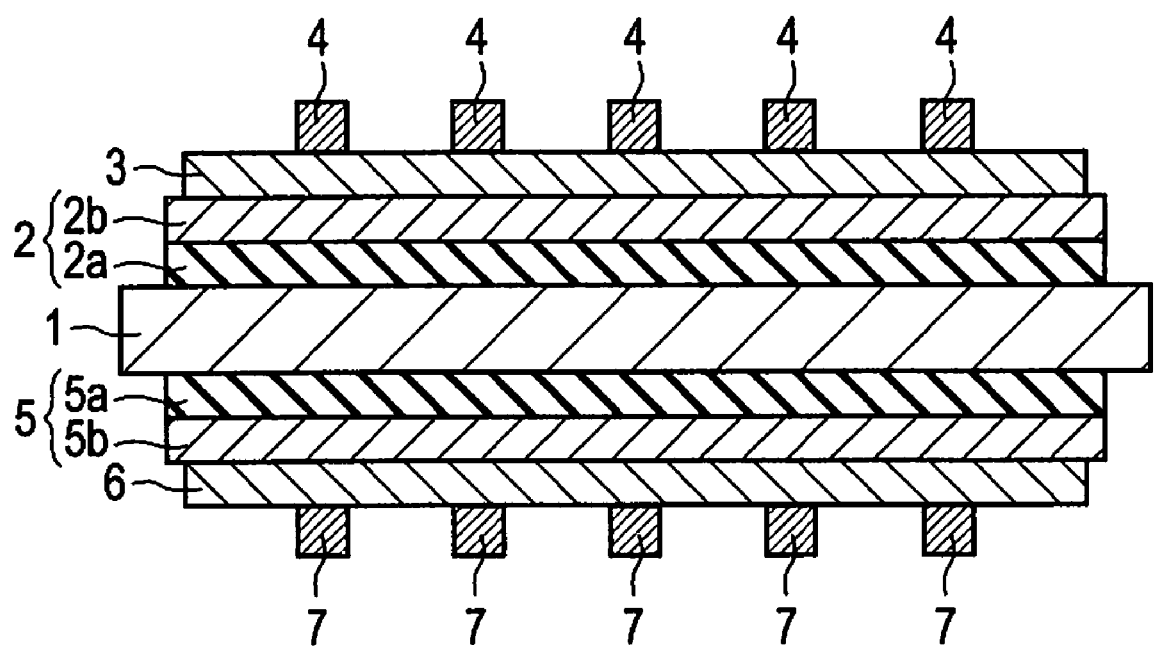
FIG. 1 is a cross-sectional view showing a structure of a photovoltaic device according to an embodiment of the invention.

FIG. 1 is a cross-sectional view showing a structure of a photovoltaic device according to an embodiment. First, the structure of the photovoltaic device according to this embodiment is described with reference to FIG. 1.

According to the photovoltaic device of this embodiment, as shown in FIG. 1, on a top face of n-type single-crystal silicon (c-Si) substrate 1, there are sequentially formed amorphous silicon (a-Si) layer 2, surface electrode 3 essentially made of ITO (indium tin oxide) having a thickness in a range from about 70 nm to about 100 nm, and collector electrodes 4 essentially made of silver having a thickness of several tens of micrometers. Amorphous silicon layer 2 includes: substantially intrinsic i-type amorphous silicon layer 2a which is formed on the top face of n-type single-single crystal silicon substrate 1 and which has a small thickness in a range from about 9 nm to about 13 nm; and p-type amorphous silicon layer 2b doped with boron (B) which is formed on i-type amorphous silicon layer 2a and which has a thickness in a range from about 2 nm to about 8 nm. The thickness in the range from about 9 nm to about 13 nm of i-type amorphous silicon layer 2a is so small that the i-type amorphous silicon layer 2a cannot substantially contribute to power generation as a photoactive layer. Here, n-type single-crystal silicon substrate 1, i-type amorphous silicon layer 2a, and p-type amorphous silicon layer 2b are examples of a "crystalline silicon", a "second amorphous silicon layer", and a "first amorphous silicon layer", respectively.

Meanwhile, on a back face of n-type single-crystal silicon substrate 1, there are formed amorphous silicon layer 5, back face electrode 6 essentially made of ITO having a thickness in a range from about 70 nm to about 100 nm, and collector electrodes 7 essentially made of silver having a thickness of several tens of micrometers, which are sequentially formed starting from a position closer to the back face of n-type single-crystal silicon substrate 1. Amorphous silicon layer 5 includes: substantially intrinsic i-type amorphous silicon layer 5a which is formed on the back face of n-type single-single crystal silicon substrate 1 and which has a small thickness in a range from about 9 nm to about 13 nm; and n-type amorphous silicon layer 5b doped with phosphorus (P) that is formed on a back face of i-type amorphous silicon layer 5a and which has a thickness in a range from about 10 nm to about 20 nm. Meanwhile, the thickness in the range from about 9 nm to about 13 nm of i-type amorphous silicon layer 5a is so small that i-type amorphous silicon layer 5a cannot substantially contribute to power generation. Moreover, i-type amorphous silicon layer 5a, n-type amorphous silicon layer 5b, and back face electrodes 6 collectively constitute a so-called BSF (back surface field) structure.

Figure 2:
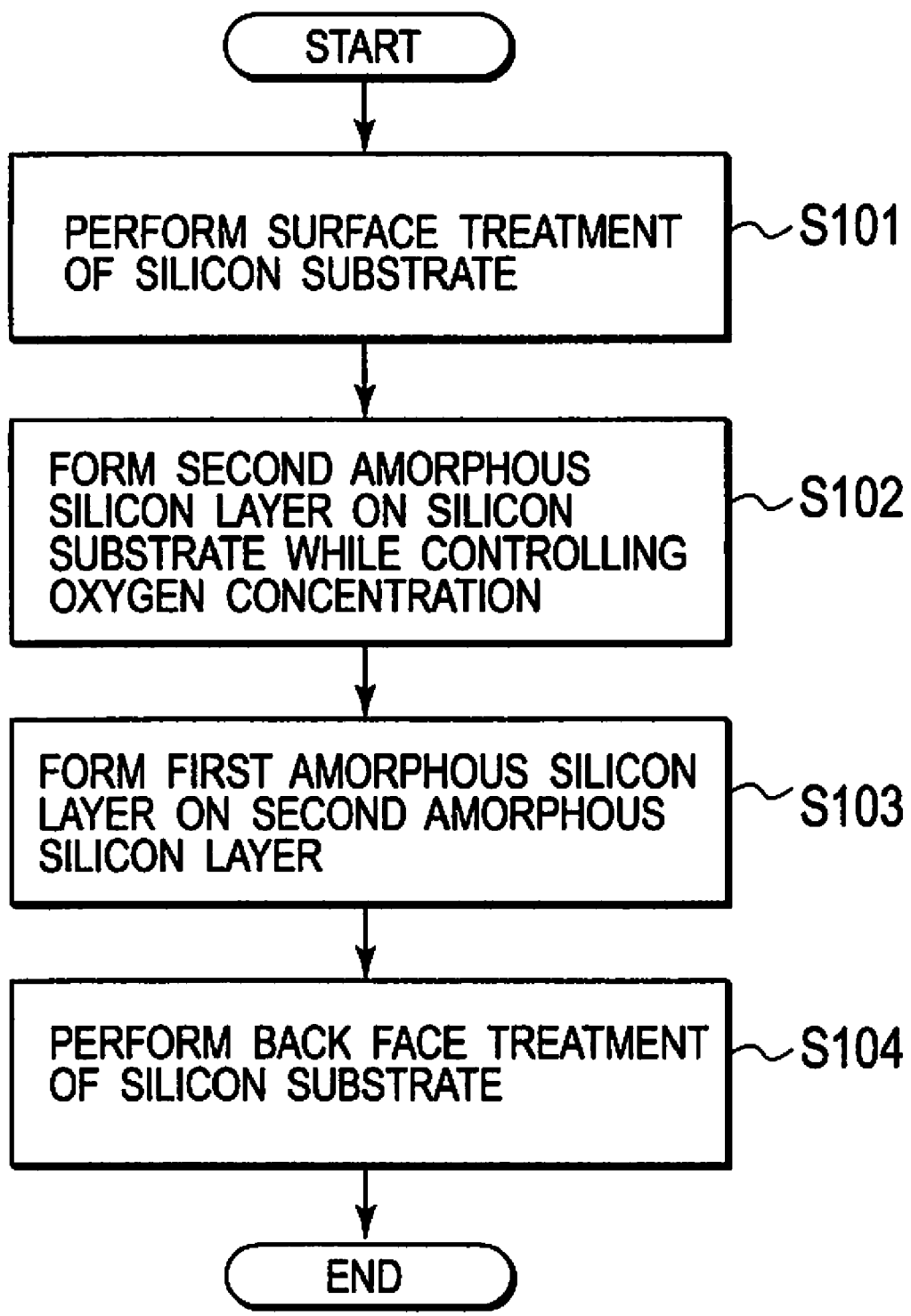
FIG. 2 is a flowchart of a method of manufacturing the photovoltaic device.

FIG. 2 is a flowchart of a method of manufacturing the photovoltaic device. The method of manufacturing the photovoltaic device according to the above-described embodiment is described with reference to FIG. 1 and FIG. 2.

First, a surface treatment of n-type single-crystal silicon substrate 1 is performed (Step S101). As shown in FIG. 1, after disposing cleaned n-type single-crystal silicon substrate 1 in a vacuum chamber (not shown), moisture attached to the surface of n-type single-crystal silicon substrate 1 is removed as much as possible by heating n-type single-crystal silicon substrate 1 under a temperature condition equal to or below 200° C. In this way, it is possible to suppress formation of defects, which is caused by the fact that the oxygen in the moisture attached to the surface of n-type single-crystal silicon substrate 1 combines with silicon.

Next, a hydrogen treatment is performed on the top face of n-type single-crystal silicon substrate 1 by introducing hydrogen ($H_2$) gas thereinto and thus by performing plasma discharge, while maintaining a substrate temperature to 170° C. In this way, the top face of n-type single-crystal silicon substrate 1 is cleaned and hydrogen atoms are adsorbed in the vicinity of the surface of n-type single-crystal silicon substrate 1. Defects on the top face of n-type single-crystal silicon substrate 1 are inactivated (terminated) by these adsorbed hydrogen atoms.

Thereafter, the respective layers are formed on the surface and the back face of n-type single-crystal silicon substrate 1 under conditions as shown in Table 1 below.

TABLE 1

| | | Conditions of formation | | | |
|---|---|---|---|---|---|
| Treatments | | Substrate temperature (° C.) | Used gas (sccm) | Pressure (Pa) | Power density (mW/cm$^2$) |
| Surface side | i layer (a-Si) | 170 | $SiH_4$: 40 $CO_2$: 0 to 10 | 40 | 8.33 |
| | p layer (a-Si) | 170 | $H_2$: 0 to 100 $SiH_4$: 40 $B_2H_6$ (2%): 40 | 40 | 8.33 |
| Back face side | i layer (a-Si) | 170 | $SiH_4$: 40 | 40 | 8.33 |
| | n layer (a-Si) | 170 | $H_2$: 0 to 100 $SiH_4$: 40 $PH_3$ (1%): 40 | 40 | 8.33 |

Figure 3:
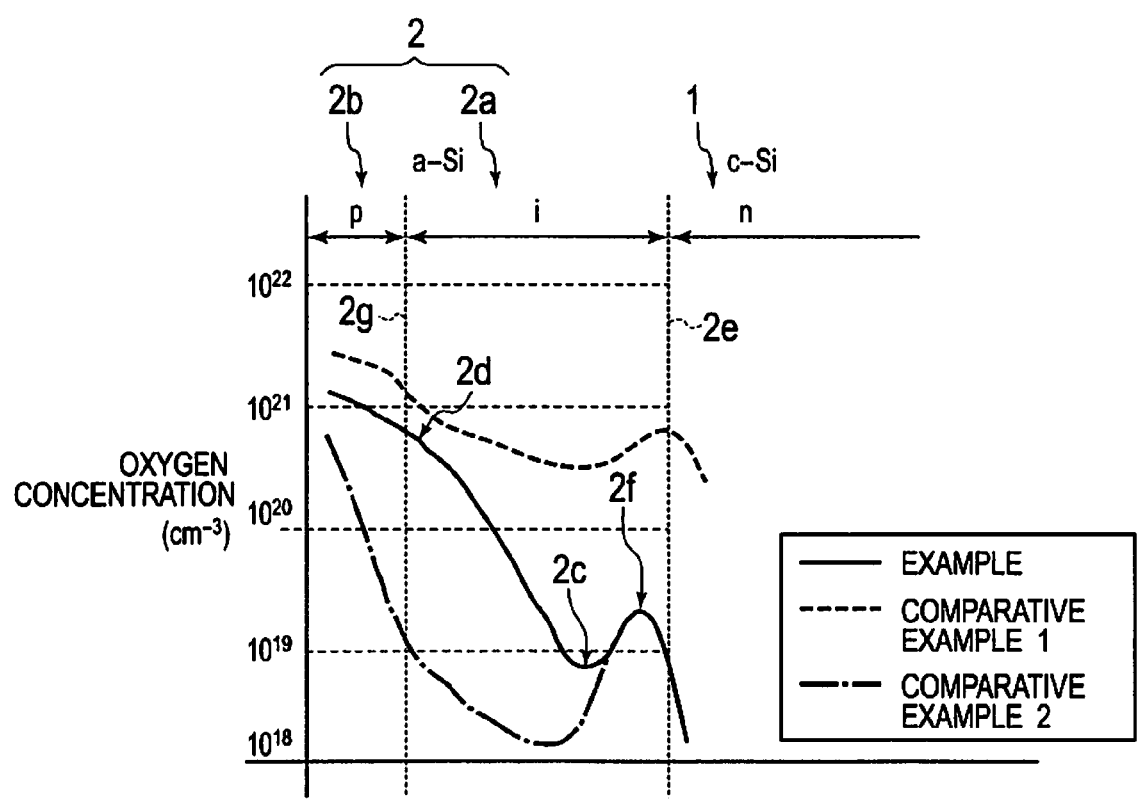
FIG. 3 is a graph showing concentration profiles of oxygen atoms on an i-type amorphous silicon layer of the photovoltaic device shown in FIG. 1.

To be more precise, as shown in Table 1, i-type amorphous silicon layer 2a having the thickness of 10 nm is formed on the top face of n-type single-crystal silicon substrate 1, by using a RF (radio-frequency) plasma CVD (chemical vapor deposition) method, under condition that: the substrate temperature is 170° C.; a flow rate of silane ($SiH_4$) gas is 40 sccm; a flow rate of $CO_2$ gas is 0 to 10 sccm; pressure is 40 Pa; and RF power density is 8.33 mW/cm$^2$. Here, in this embodiment, the flow rate of the used gas ($CO_2$) is changed continuously in a range from 0 to 10 sccm so as to control such that an oxygen concentration in i-type amorphous silicon layer 2a becomes lower on n-type single-crystal silicon substrate 1 side and higher on p-type amorphous silicon layer 2b side. In this way, i-type amorphous silicon layer 2a having an oxygen concentration profile as indicated with a solid line (example) in FIG. 3 is formed (Step S102).

Subsequently, as shown in Table 1, boron (B) doped p-type amorphous silicon layer 2b having the thickness of 6 nm is formed on i-type amorphous silicon layer 2a, by using the RF plasma CVD method, under condition that: the substrate temperature is 170° C.; a flow rate of hydrogen ($H_2$) gas is 0 to 10 sccm; a flow rate of diborane ($B_2H_6$)/$H_2$ (a concentration of the $B_2H_6$ gas relative to $H_2$: 2%) is 40 sccm; the pressure is 40 Pa; and the RF power density is 8.33 mW/cm². (Step S103).

Next, surface electrode 3 which is essentially made of ITO (indium tin oxide) and which has a thickness of 85 nm is formed on the top face of p-type amorphous silicon layer 2b by using a sputtering method. Thereafter, collector electrodes 4 which are essentially made of silver and which have a thickness of several tens of micrometers are formed in predetermined regions on surface electrode 3 by using a screen printing method.

Next, a back face treatment of the silicon substrate is performed (Step S104). For example, as shown in FIG. 1, i-type amorphous silicon layer 5a having the thickness of 10 nm is formed on the back face of n-type single-crystal silicon substrate 1, by using the RF plasma CVD method, under condition that: the substrate temperature is 170° C.; the flow rate of silane ($SiH_4$) gas is 40 sccm; the pressure is 40 Pa; and the RF power density is 8.33 mW/cm².

Subsequently, as shown in Table 1, phosphorus (P) doped n-type amorphous silicon layer 5b having the thickness of 15 nm is formed on the back face of i-type amorphous silicon layer 5a, by using the RF plasma CVD method, under condition that: the substrate temperature is 170° C.; the flow rate of hydrogen ($H_2$) gas is 0 to 10 sccm; the flow rate of silane ($SiH_4$) gas is 40 sccm; a flow rate of phosphine ($PH_3$)/$H_2$ (a concentration of the $PH_3$ relative to $H_2$: 1%) is 40 sccm; the pressure is 40 Pa; and the RF power density is 8.33 mW/cm².

Lastly, by using the sputtering method, back face electrode 6 which is essentially made of ITO and which has the thickness of 85 nm is formed on the back face of n-type amorphous silicon layer 5b, and then collector electrodes 7 which are essentially made of silver and which have the thickness of several tens of micrometers are formed in predetermined regions on back face electrode 6. In this way, the photovoltaic device corresponding to the embodiment shown in FIG. 1 is formed.

Meanwhile, according to a photovoltaic device of Comparative Example 1, the i-type amorphous silicon layer is formed under the following condition. That is, a flow rate of the $CO_2$ gas is maintained close to 10 sccm, which is higher than the usual flow rate. On the other hand, according to a photovoltaic device of Comparative Example 2, the i-type amorphous silicon layer is formed under the following condition. That is, a flow rate of the $CO_2$ gas is maintained close to 0 sccm, which is lower than the usual flow rate. Other conditions of formation of the photovoltaic device according to Comparative Examples 1 and 2 are the same as the manufacturing process in Example.

Next, concentration profiles of oxygen atoms in the i-type amorphous silicon layers are measured about the photovoltaic devices according to Example, Comparative Example 1, and Comparative Example 2, respectively, fabricated in accordance with the above-described manufacturing processes.

FIG. 3 is a graph showing the concentration profiles of oxygen atoms on the i-type amorphous silicon layers of the photovoltaic devices. The concentration profiles of oxygen atoms are measured by SIMS (a secondary ion mass spectrometer: ADEPT 1010, Physical Electronics, Inc.) At this time, the measurement is conducted under the following conditions, namely, an ion source for irradiation: a $Cs^+$ ion; ion irradiation energy: 1 keV; a secondary ion source for detection: an $O^-$ ion; and a secondary ion source for reference: a $Si^-$ ion. Here, in the measurement using the SIMS, the oxygen concentrations are found by counting the number of the secondary ions (the $O^-$ ion and the $Si^-$ ion) emitted by irradiation of the $CS^+$ ions onto the photovoltaic devices, and thus by calculating a ratio of the number [$O^-$] of the $O^-$ ions relative to the number [$Si^-$] of the $Si^-$ ions ([$O^-$]/[$Si^-$]).

FIG. 3 shows the concentration profiles of oxygen atoms in i-type amorphous silicon layers 2a of the photovoltaic devices according to Example (a solid line), Comparative Example 1 (a dotted line), and Comparative Example 2 (a dashed line) measured with the SIMS.

Here, as indicated with the solid line (Example) in FIG. 3, i-type amorphous silicon layer 2a of the photovoltaic device according to Example includes: first section 2c which is located on n-type single-crystal silicon substrate 1 side, and which has an oxygen concentration equal to or below $10^{20}$ cm⁻³; second section 2d which is located on p-type amorphous silicon layer 2b side, and which has an oxygen concentration equal to or above $10^{20}$ cm⁻³; and third section 2f which is located closer to n-type single-crystal silicon substrate 1 than first section 2c, and which is located in the vicinity of interface 2e between n-type single-crystal silicon substrate 1 and i-type amorphous silicon layer 2a.

Note that the above-mentioned oxygen concentration of $10^{20}$ cm⁻³ has the following critical significance. Since a concentration of silicon (Si) in i-type amorphous silicon layer 2 is approximately $5 \times 10^{22}$ cm⁻³, the concentration ratio of oxygen relative to silicon (Si) becomes 0.002 when the oxygen concentration is $10^{20}$ cm⁻³. A position near this value (0.002) serves as a boundary. Specifically, the oxygen behaves as an impurity in the silicon, when the concentration ratio is lower than 0.002. On the contrary, the oxygen reacts with the silicon and acquires a property of a compound of oxygen and silicon (SiO), when the concentration ratio is higher than 0.002. In other words, the property of i-type amorphous silicon layer 2a changes in the vicinity of the oxygen concentration of $102°$ cm⁻³.

Meanwhile, as to i-type amorphous silicon layer 2a in amorphous silicon layer 2, the oxygen concentration has the highest value in the vicinity of interface 2g between i-type amorphous silicon layer 2a and p-type amorphous silicon layer 2b, and is then gradually reduced from second section 2d to first section 2c. Then, i-type amorphous silicon layer 2a has the oxygen concentration equal to or below $10^{20}$ cm⁻³ (the lowest value (the minimum value)) at first section 2c. Moreover, the oxygen concentration is increased gradually from first section 2c to third section 2f which is located in the vicinity of interface 2e between n-type single-crystal silicon substrate 1 and i-type amorphous silicon layer 2a, so that i-type amorphous silicon layer 2a has the oxygen concentration (the maximum value) which is higher than the oxygen concentration at first section 2c and lower than the oxygen concentration at second section 2d. Meanwhile, the concentration ratio of the oxygen concentration at second section 2d relative to the oxygen concentration at first section 2c is at least equal to or above 50.

Here, according to the oxygen concentration profile of Example shown in FIG. 3, first section 2c and third section 2f are located away from interface 2e between n-type single-crystal silicon substrate 1 and i-type amorphous silicon layer 2a. This is attributable to the measurement principle using the SIMS. Actually, third section 2f is located in a region having a distance of 2 to 3 atomic layers away from interface 2e between n-type single-crystal silicon substrate 1 and i-type amorphous silicon layer 2a. Meanwhile, in the oxygen concentration profile of Example, first section 2c is located extremely close to third section 2f. In other words, first section 2c is located in the vicinity of interface 2e between n-type single-crystal silicon substrate 1 and i-type amorphous silicon layer 2a.

On the other hand, in the oxygen concentration profile of the photovoltaic device according to Comparative Example 1 (the dotted line), the oxygen concentration is greater than that of Example, and is higher than $10^{20}$ cm$^{-3}$ on the whole. In the meantime, in the oxygen concentration profile of the photovoltaic device according to Comparative Example 2 (the dashed line), the oxygen concentration in a region corresponding to third section 2f of Example is substantially equal to the oxygen concentration of third section 2f of Example. Meanwhile, the oxygen concentration in a region corresponding to first section 2c and second section 2d of Example is lower than the oxygen concentration of first section 2c and second section 2d of Example, which is lower than $10^{20}$ cm$^{-3}$ on the whole.

Next, output characteristics of the photovoltaic device according to Example, Comparative Example 1, and Comparative Example 2 are measured. Measured data include Voc (open voltage), Isc (short-circuit current), F.F (fill factor), and Pmax (cell output). The measurement results are shown in Table 2 below.

TABLE 2

| | Voc (V) | Isc (A) | F.F | Pmax (W) |
|---|---|---|---|---|
| Example | 0.721 | 3.759 | 0.755 | 2.046 |
| Comparative Example 1 | 0.693 | 3.758 | 0.751 | 1.956 |
| Comparative Example 2 | 0.710 | 3.761 | 0.758 | 2.024 |

As shown in Table 2, the output characteristic in Comparative Example 2 is improved, as compared to the output characteristic in Comparative Example 1. Here, the former has the oxygen density in the i-type amorphous silicon layer lower than $10^{20}$ cm$^{-3}$ on the whole, and the latter has the oxygen density in the i-type amorphous silicon layer higher than $10^{20}$ cm$^{-3}$ on the whole. To be more precise, the open voltage Voc in Comparative Example 1 is 0.693 V, whereas the open voltage Voc in Comparative Example 2 is 0.710 V. This is considered attributable to the following reason. Specifically, since the oxygen concentration in Comparative Example 2 is lower than that in Comparative Example 1, Comparative Example 2 has fewer defects in the i-type amorphous silicon layer than Comparative Example 1. For this reason, occurrence of capture of the photogenerated carriers attributable to the defects is suppressed more in Comparative Example 2 than in Comparative Example 1. It is therefore conceivable that the open voltage Voc becomes higher in Comparative Example 2.

Meanwhile, it is turned out that the output characteristic is further improved in Example including second section 2d with the oxygen concentration higher than Comparative Example 2. To be more precise, the open voltage Voc in Comparative Example 2 is 0.710 V, whereas the open voltage in Example is 0.721 V. This is considered attributable to the following reason. Specifically, by increasing the oxygen concentration having the property as the n-type dopant in second section 2d, it is possible to impart the relatively strong n-type property to second section 2d that includes interface 2g between i-type amorphous silicon layer 2a and p-type amorphous silicon layer 2b. In this way, the internal electric field becomes relatively strong on interface 2g, and thus it is conceivable that the photogenerated carriers can be smoothly separated.

Meanwhile, Comparative Example 2 has the larger short-circuit current Isc than Comparative Example 1, and the short-circuit current in Example is larger than in Comparative Example 1 but smaller than Comparative Example 2. To be more precise, the short-circuit currents Isc in Comparative Example 1, Comparative Example 2, and Example are 3.758 A, 3.761 A, and 3.759 A, respectively. In other words, the short-circuit current becomes larger as the oxygen concentration becomes smaller. Nevertheless, significant differences are not observed among Example, Comparative Example 1, and Comparative Example 2.

Meanwhile, Comparative Example 2 has the larger fill factor F. F than Comparative Example 1, and the fill factor F. F in Example is larger than in Comparative Example 1 but smaller than Comparative Example 2. To be more precise, the fill factor F. F in Comparative Example 1, Comparative Example 2, and Example are 0.751, 0.758, and 0.755, respectively. In other words, the fill factor F. F becomes larger as the oxygen concentration becomes smaller. Nevertheless, significant differences are not observed among Example, Comparative Example 1, and Comparative Example 2.

In the meantime, Comparative Example 2 has the larger cell output $P_{max}$ than Comparative Example 1, and the cell output $P_{max}$ in Example turns out to be even larger than in Comparative Example 2. To be more precise, the cell output $P_{max}$ in Comparative Example 1, Comparative Example 2, and Example are 1.956 W, 2.024 W, and 2.046 W, respectively. In this way, the cell output in Example is improved in comparison with Comparative Examples 1 and 2. In other words, capture of the carriers attributable to defects caused by the oxygen in the vicinity of interface 2e between n-type single-crystal silicon substrate 1 and i-type amorphous silicon layer 2a is suppressed because first section 2c has the lower oxygen concentration, and at the same time, separation of the photogenerated carriers is achieved smoothly in the vicinity of interface 2g between p-type amorphous silicon layer b and i-type amorphous silicon layer 2a because second section 2d has the higher oxygen concentration. For these reasons, the above-mentioned results are conceivably obtained.

As described above, according to Example, on substantially intrinsic i-type amorphous silicon layer 2a, there are formed first section 2c which is located on n-type single-crystal silicon substrate 1 side and which has the oxygen concentration equal to or below $10^{20}$ cm$^{-3}$, and second section 2d which is located on p-type amorphous silicon layer 2 side and which has the oxygen concentration equal to or above $10^{20}$ cm$^{-3}$. Thus, it is possible to decrease the oxygen concentration on n-type single-crystal silicon substrate 1 side of substantially intrinsic i-type amorphous silicon layer 2a, and to increase the oxygen concentration on p-type amorphous silicon layer 2b side thereof. In this way, by using first section 2c of i-type amorphous silicon layer 2a which is located on n-type single-crystal silicon substrate 1 side and which has the lower oxygen concentration, it is possible to form n-type single-crystal silicon substrate 1 side of substantially intrinsic i-type amorphous silicon layer 2a into high-quality amorphous silicon with few impurities (oxygen). At the same time, since defects attributable to the oxygen in first section 2c are reduced, it is possible to suppress occurrence of capture of the photogenerated carriers in first section 2c.

Moreover, by providing second section 2d which is located on p-type amorphous silicon layer 2b side of i-type amorphous silicon layer 2a and has which the higher oxygen concentration, it is possible to impart the relatively strong n-type property to n-type single-crystal silicon substrate 1 side of i-type amorphous silicon layer 2a by the oxygen having the property as the n-type dopant. In this way, it is possible to provide the relatively strong internal electric field in the vicinity of interface 2g between substantially intrinsic i-type amorphous silicon layer 2a and p-type amorphous silicon layer 2b. Accordingly, it is possible to achieve separation of the photogenerated carriers smoothly. As described previously, since it is possible to suppress occurrence of capture of the photogenerated carriers on n-type single-crystal silicon substrate 1 side of substantially intrinsic i-type amorphous silicon layer 2a, and to separate the photogenerated carriers smoothly on p-type amorphous silicon layer 2b side of i-type amorphous silicon layer 2a, the output characteristic of the photovoltaic device can be improved as a consequence.

In addition, according to Example, third section 2f is formed on i-type amorphous silicon layer 2a. Here, third section 2f has the higher oxygen concentration than the oxygen concentration of first section 2c, and is located, closer to n-type single-crystal silicon substrate 1 than first section 2c, and in the vicinity of interface 2e between n-type single-crystal silicon substrate 1 and i-type amorphous silicon layer 2a. Thus, it is possible to increase the oxygen concentration in the vicinity of interface 2e between n-type single-crystal silicon substrate 1 and i-type amorphous silicon layer 2a. In this way, more two-coordinate oxygen atoms are mixed in a network formed by covalent bonds of four-coordinate silicon atoms in the vicinity of interface 2e. Accordingly, it is possible to increase structural flexibility of the network in the vicinity of interface 2e, and to improve a terminal function.

Meanwhile, according to Example, it is possible to reduce defects attributable to oxygen in first section 2c by setting the oxygen concentration in first section 2c to be the smallest in i-type amorphous silicon layer 2a. In this way, it is possible to suppress occurrence of capture of the carriers caused by the defects.

Moreover, according to Example, it is possible to increase the inner electric field between i-type amorphous silicon layer 2a and p-type amorphous silicon layer 2b by setting the oxygen concentration of second section 2d to be higher than the oxygen concentration of third section 2f.

Further, according to Example, it is possible to increase the inner electric field between i-type amorphous silicon layer 2a and p-type amorphous silicon layer 2b by setting the oxygen concentration of second section 2d to be the highest in the vicinity of interface 2g between p-type amorphous silicon layer 2b and i-type amorphous silicon layer 2a.

Meanwhile, according to Example, by setting the concentration ratio of second section 2d relative to the oxygen concentration of first section 2c to be at least equal to or above 50, it is possible to reduce the oxygen concentration in second section 2d, and to increase the oxygen concentration in first section 2c while reducing the oxygen concentration in i-type amorphous silicon layer 2a on the whole.

It is to be understood that Embodiment and Example disclosed herein are examples, and are not restrictive in all aspects. The scope of the present invention will be defined not by Embodiment and Example described above but by the appended claims. Moreover, the present invention encompasses all modifications equivalent to and within the range of the appended claims.

For example, Embodiment and Example describe the example of forming amorphous silicon layer 2 (i-type amorphous silicon layer 2a and p-type amorphous silicon layer 2b) by the RF plasma CVD method. However, the present invention will not be limited only to this configuration. It is also possible to form amorphous silicon layer 2 by other thin-film forming methods including an ECR (electron cyclotron resonance) plasma CVD method, a Cat-CVD (catalytic chemical vapor deposition) method, a sputtering method, and so forth.

Moreover, Embodiment and Example include the BSF structure by forming amorphous silicon layer 5 (i-type amorphous silicon layer 5a and n-type amorphous silicon layer 5b) on the back face of n-type single-crystal silicon substrate 1. However, the present invention will not be limited only to this configuration. It is also possible to form the back face electrode without forming the n-side (back side) amorphous silicon layer on the back face of the n-type single-crystal silicon substrate.

Furthermore, Embodiment and Example describe the example of forming amorphous silicon layer 2 and amorphous silicon layer 5 respectively on the surface and the back face of n-type single-crystal silicon substrate 1. However, the present invention will not be limited only to this configuration. It is also possible: to form, on a surface of a p-type single-crystal silicon substrate, a surface side amorphous silicon layer essentially made of an i-type amorphous silicon layer and an n-type amorphous silicon layer; and to form, on a back face of the p-type single-crystal silicon substrate, a back face side amorphous silicon layer essentially made of an i-type amorphous silicon layer and a p-type amorphous silicon layer. In this case, the present invention is applicable to the p-type single-crystal silicon substrate, and to the i-type amorphous silicon layer and the p-type amorphous silicon layer of the back face side amorphous silicon layer.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A photovoltaic device comprising:
   crystalline silicon of a first conductivity type;
   a first amorphous silicon layer of a second conductivity type; and
   a substantially intrinsic second amorphous silicon layer disposed between the crystalline silicon and the first amorphous silicon layer having a thickness such that light absorbed by the second amorphous silicon layer does not substantially contribute to power generation, the second amorphous silicon layer comprising:
   a first section located on the crystalline silicon side and having a first oxygen concentration equal to or below $10^{20}$ cm$^{-3}$, and
   a second section located on the first amorphous silicon layer side and having a second oxygen concentration equal to or above $10^{20}$ cm$^{-3}$, wherein the oxygen concentration at the junction between the crystalline silicon and the substantially intrinsic second amorphous silicon layer is equal to or below $10^{20}$ cm$^{-3}$, wherein the second amorphous silicon layer further comprises a third section that has a third oxygen concentration larger than the first oxygen concentration, and which is located closer to the crystalline silicon than the first section, and in the vicinity of the interface between the crystalline silicon and the second amorphous silicon layer.

2. The photovoltaic device of claim 1,
wherein the second oxygen concentration of the second section is higher than the third oxygen concentration of the third section.

3. The photovoltaic device of claim 1,
wherein the second oxygen concentration of the second section is the highest in the vicinity of the interface between the first amorphous silicon layer and the second amorphous silicon layer.

4. The photovoltaic device of claim 1,
wherein the concentration ratio of the second oxygen concentration of the second section relative to the first oxygen concentration of the first section is equal to or above 50.

5. The photovoltaic device of claim 1,
wherein the first oxygen concentration of the first section is the lowest in the second amorphous silicon layer.

6. A method of manufacturing a photovoltaic device comprising:
performing a treatment on a surface of crystalline silicon of a first conductivity type;
forming a substantially intrinsic second amorphous silicon layer on the crystalline silicon of the first conductivity type, the second amorphous silicon layer having a thickness such that light absorbed by the second amorphous silicon layer does not substantially contribute to power generation such that an oxygen concentration is low in a first face, on the first conductivity type crystalline silicon side, of the second amorphous silicon layer, and that an oxygen concentration is high in a second face of the second amorphous silicon layer, the second face being opposite to the first face on the first conductivity type crystalline silicon side; wherein the second amorphous silicon layer is formed by forming a first section located on the crystalline silicon side and having a first oxygen concentration equal to or below $10^{20}$ cm$^{-3}$; forming a second section being located on the first amorphous silicon layer side and having a second oxygen concentration equal to or above $10^{20}$ cm$^{-3}$; and forming a third section that has a third oxygen concentration larger than the first oxygen concentration, and which is located, closer to the crystalline silicon than the first section, and in the vicinity of the interface between the crystalline silicon and the second amorphous silicon layer;
forming a first amorphous silicon layer of a second conductivity type on the second amorphous silicon layer; and
processing a face, opposite to that on which the second amorphous silicon layer is formed, of the crystalline silicon of the first conductivity type.

7. The method of claim 5,
wherein, when the second amorphous silicon layer is formed, a flow rate of an ambient gas is controlled so that the oxygen concentration becomes low on the first face on the first conductivity type crystalline silicon side, and that the oxygen concentration becomes high on the second face on the first conductivity type crystalline silicon side, of the second amorphous silicon layer.

8. The method of claim 6,
wherein, forming the second amorphous silicon layer, includes: with controlling the flow rate of the ambient gas,
forming a first section located on the crystalline silicon side and having a first oxygen concentration equal to or below $10^{20}$ cm$^{-3}$; and
forming a second section being located on the first amorphous silicon layer side and having a second oxygen concentration equal to or above $10^{20}$ cm$^{-3}$.

9. The method of claim 6,
wherein the second oxygen concentration of the second section is higher than the third oxygen concentration of the third section.

10. The method of claim 7,
wherein the second oxygen concentration of the second section is the highest in the vicinity of the interface between the first amorphous silicon layer and the second amorphous silicon layer.

11. The method of claim 7,
wherein the concentration ratio of the second oxygen concentration of the second section relative to the first oxygen concentration of the first section is equal to or above 50.

12. The method of claim 7,
wherein the first oxygen concentration of the first section is the lowest in the second amorphous silicon layer.

13. A photovoltaic device comprising:
crystalline silicon of a first conductivity type;
a first amorphous silicon layer of a second conductivity type; and
a substantially intrinsic second amorphous silicon layer having a thickness in a range from about 9 nm to about 13 nm and disposed between the crystalline silicon and the first amorphous silicon layer, the second amorphous silicon layer comprising: a first section located on the crystalline silicon side and having a first oxygen concentration equal to or below $10^{20}$ cm$^{-3}$, and
a second section located on the first amorphous silicon layer side and having a second oxygen concentration equal to or above $10^{20}$ cm$^{-3}$ and a third section having a third oxygen concentration which is located closer to the crystalline silicon than the first section, and in the vicinity of the interface between the crystalline silicon and the second amorphous silicon layer, wherein the first oxygen concentration at the crystalline silicon face on the side towards the second amorphous layer is less than the third oxygen concentration.

14. The method of claim 5, wherein the step of forming a substantially intrinsic second amorphous silicon layer comprises chemical vapor deposition wherein CO2 gas flow is changed to provide a varied oxygen concentration in the i-type amorphous silicon layer.

* * * * *